(12) United States Patent
Sim et al.

(10) Patent No.: US 7,368,933 B2
(45) Date of Patent: May 6, 2008

(54) METHOD FOR TESTING STANDBY CURRENT OF SEMICONDUCTOR PACKAGE

(75) Inventors: Moon-Bo Sim, Gyeonggi-do (KR); Joo-Seok Kwak, Chungcheongnam-do (KR); Seong-Su Kim, Chungcheongnam-do (KR); Yun-Bo Yang, Chungcheongnam-do (KR); Sun-Ki Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/335,270

(22) Filed: Jan. 18, 2006

(65) Prior Publication Data

US 2006/0158205 A1 Jul. 20, 2006

(30) Foreign Application Priority Data

Jan. 19, 2005 (KR) .................. 10-2005-0005071

(51) Int. Cl.
*G01R 31/01* (2006.01)
*G01R 31/28* (2006.01)
*G01R 31/26* (2006.01)

(52) U.S. Cl. .............. 324/765; 324/763; 324/158.1; 324/754; 438/15; 438/18

(58) Field of Classification Search ........ 324/754–765; 438/10–18
See application file for complete search history.

(56) References Cited

U.S. PATENT DOCUMENTS

| | | | |
|---|---|---|---|
| 6,013,533 A * | 1/2000 | Sugasawara et al. .......... | 438/10 |
| 6,175,245 B1 | 1/2001 | Bowe et al. | |
| 6,593,590 B1 * | 7/2003 | Yang et al. .................. | 257/48 |

(Continued)

FOREIGN PATENT DOCUMENTS

JP  10-090346  4/1998

(Continued)

OTHER PUBLICATIONS

English language abstract of Korean Publication No. 2000-0002076.

(Continued)

*Primary Examiner*—Ha Tran Nguyen
*Assistant Examiner*—Emily Y Chan
(74) *Attorney, Agent, or Firm*—Marger Johnson & McCollom, P.C.

(57) ABSTRACT

A system and method for testing standby current of a semiconductor package is provided. The method includes testing semiconductor chips formed on a wafer having a predetermined wafer run number, collecting measured values of standby current of the semiconductor chips, and storing the measured values of standby current in a database, by using a wafer tester; recognizing a wafer run number of each of semiconductor packages to be tested; downloading measured values of standby current of semiconductor chips corresponding to the recognized wafer run number from the database to a semiconductor package tester; extracting a boundary value defining predetermined upper values of the downloaded measured values of standby current, by using the semiconductor package tester; setting the boundary value as a standby current limit of a program for testing the semiconductor packages by use of the semiconductor package tester; and testing the semiconductor packages based on the standby current limit.

16 Claims, 6 Drawing Sheets

U.S. PATENT DOCUMENTS 6,830,941 B1 * 12/2004 Lin et al. .................... 438/14
2002/0189981 A1 * 12/2002 Beffa ......................... 209/573

FOREIGN PATENT DOCUMENTS

| JP | 10-206499 | | 8/1998 |
| JP | 2003-043099 | * | 2/2003 |
| KR | 2000-0002076 | | 1/2000 |

OTHER PUBLICATIONS

English language abstract of Japan Publication No. 10-090346.
English language abstract of Japan Publication No. 10-206499.

* cited by examiner

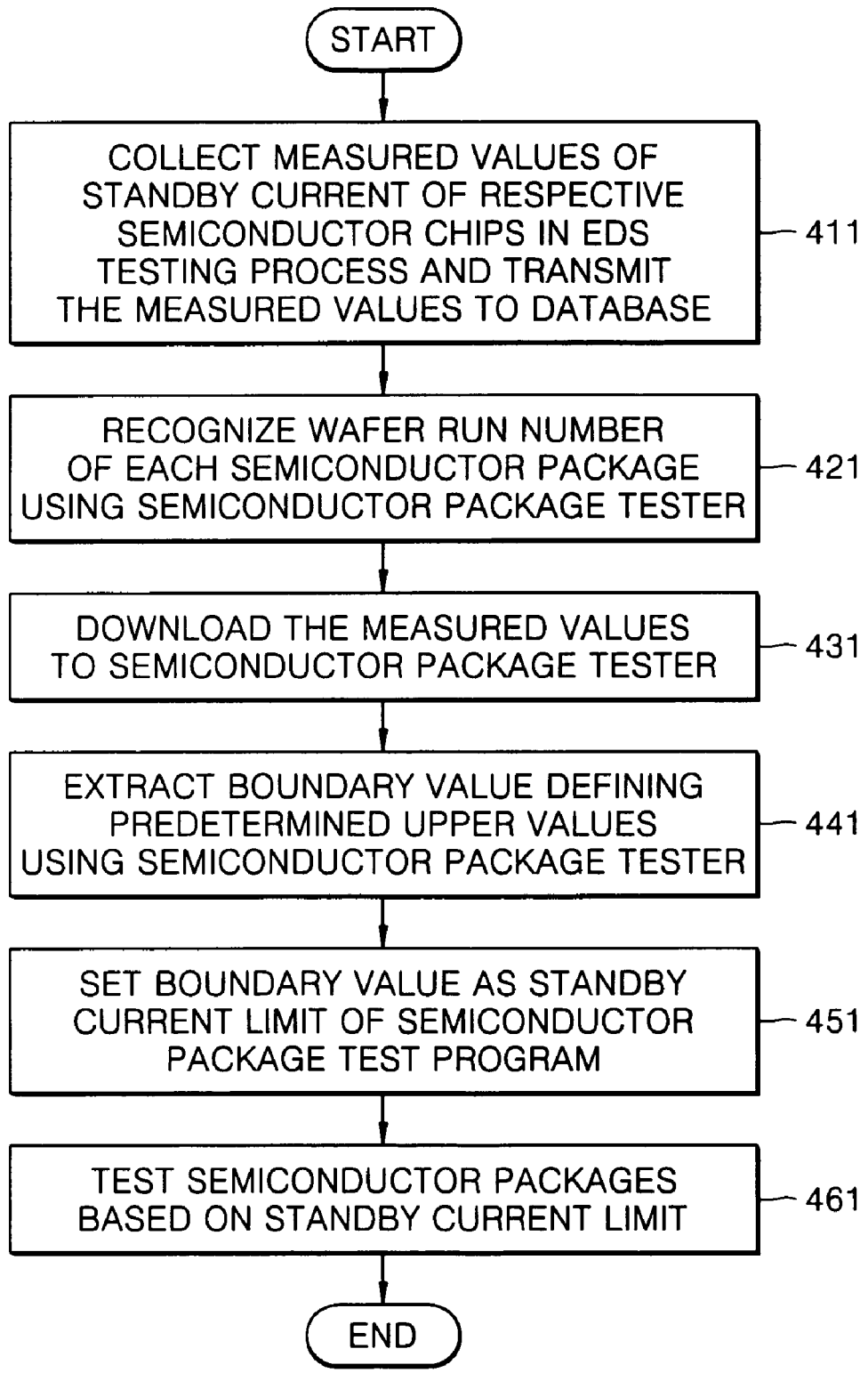

US 7,368,933 B2

METHOD FOR TESTING STANDBY CURRENT OF SEMICONDUCTOR PACKAGE

CROSS-REFERENCE TO RELATED PATENT APPLICATIONS

This application claims the benefit of Korean Patent Application No. 10-2005-0005071, filed on Jan. 19, 2005, in the Korean Intellectual Property Office, the disclosure of which is incorporated herein in its entirety by reference.

BACKGROUND OF THE INVENTION

1. Field of the Invention

The present invention relates to a method for testing standby current of a semiconductor package, and more particularly, to a method of automatically setting a standby current limit for a package testing process based on values measured during an electrical die sort (EDS) of a wafer.

2. Description of the Related Art

To realize a particular function, a circuit is designed and a plurality of parameters are set to measure the characteristics of the circuit. The circuit is manifested as a semiconductor chip fabricated on a wafer. To check whether the semiconductor chip was fabricated as it was originally designed, the predetermined parameters are measured while the chips are on the wafer. Thereafter, the semiconductor chip is packaged. To determine whether the characteristics of the semiconductor chip have been changed during the packaging, the parameters are measured again in a package testing process.

Among those parameters, standby current is a parameter for checking the amount of leakage current dissipated in a standby mode not an operation mode. Standby current is usually leakage current of a transistor, e.g., a memory cell transistor of a semiconductor memory device. The main cause of an increase in the leakage current of a memory cell transistor is a decrease in a gate poly critical dimension or an active critical dimension. In addition, when a threshold voltage decreases according to the thickness of a gate insulating layer and cleaning conditions for a memory cell transistor, the leakage current of the memory cell transistor increases.

In this situation, when high-voltage stress is applied to a semiconductor package in a package testing process, in order to skip a burn-in process, the median (central) and statistical spread or dispersion (distribution) of the standby current may shift because of a vulnerable process management standard. Besides, the standby current may change due to various factors in wafer fabrication processes. Particularly, in a low-power semiconductor apparatus, the range of fluctuation in medians and statistical dispersions of the standby currents increase during wafer fabrication and package testing.

The change in the median value and distribution of standby current does not necessarily cause faults during fabrication or problems in product quality. However, since the test limit set for the standby current at an initial characteristic evaluation is fixed, yield loss occurs during the package testing process.

To prevent yield loss from occurring during package testing attributable to the change in the characteristics of standby current, a conventional method includes measuring the standby current of each semiconductor chip formed on a wafer when yield loss occurs or inspecting the result of wafer fabrication processes and the result of an EDS, statistically estimating the level of standby current, manually adjusting the test limit for the standby current in a package testing process, and repeating the above operations.

As described above, when standby-current yield loss occurs during package testing, a standby current limit must be adjusted manually. The manual adjustment takes a large amount of time and requires a lot of labor.

SUMMARY OF THE INVENTION

The present invention provides a method for testing standby current of a semiconductor package, by which necessity of adjusting a standby current limit in a package testing process due to the great change occurring in the characteristics of the standby current while semiconductor chips fabricated on a wafer are packaged is removed.

The present invention also provides a method for testing standby current of a semiconductor package, by which waste of labor needed to adjust a standby current limit is prevented.

According to an aspect of the present invention, there is provided a method for testing standby current of a semiconductor package, the method including (a) testing semiconductor chips formed on a wafer having a predetermined wafer run number, collecting measured values of standby current of the semiconductor chips, and storing the measured values of standby current in a database, by using a wafer tester; (b) recognizing a wafer run number of each of semiconductor packages to be tested (c) downloading measured values of standby current of semiconductor chips corresponding to the recognized wafer run number from the database to a semiconductor package tester; (d) extracting a boundary value defining predetermined upper-limit values of the downloaded measured values of standby current by use of the semiconductor package tester; (e) setting the boundary value as a standby current limit of a program for testing the semiconductor packages by use of the semiconductor package tester; and (f) testing the semiconductor packages based on the standby current limit.

The database may be connected to at least one wafer tester and at least one semiconductor package tester through a wired network.

The standby current limit may be set to sort out semiconductor packages to be tested for reliability. Wafer run numbers of the semiconductor packages to be tested may be directly input by an operator to the semiconductor package tester.

The method may further include repeating (c) through (f) whenever the wafer run number changes. Operation (d) may include extracting the boundary value for the wafer run number.

According to another aspect of the present invention, there is provided a method for testing standby current of a semiconductor package, the method including (a) testing semiconductor chips formed on a wafer having a predetermined wafer run number and transmitting measured values of standby current of the semiconductor chips to a statistic server, by using a wafer tester; (b) extracting a boundary value defining predetermined upper values of the measured values of standby current, by using the statistic server; (c) recognizing a wafer run number of each of semiconductor packages to be tested, by using a semiconductor package tester; (d) downloading the boundary value corresponding to the recognized wafer run number from the statistic server to the semiconductor package tester; (e) setting the boundary value as a standby current limit of a program for testing the semiconductor packages, by using the semiconductor package tester; and (f) testing the semiconductor packages based on the standby current limit, by using the semiconductor package tester.

The statistic server may be connected to at least one wafer tester and at least one semiconductor package tester through a wired network.

The standby current limit may be set to sort out semiconductor packages to be tested for reliability. Wafer run numbers of the semiconductor packages to be tested may be directly input by an operator to the semiconductor package tester.

The method may further include repeating operations (d) through (f) whenever the wafer run number changes. Operation (b) may include extracting the boundary value with respect to a wafer run number by using the statistic server.

BRIEF DESCRIPTION OF THE DRAWINGS

The above and other features and advantages of the present invention will become more apparent by describing in detail exemplary embodiments thereof with reference to the attached drawings in which:

FIG. 4 is a flowchart of a method for testing standby current of a semiconductor package according to an embodiment of the present invention;

DETAILED DESCRIPTION

Figure 1:
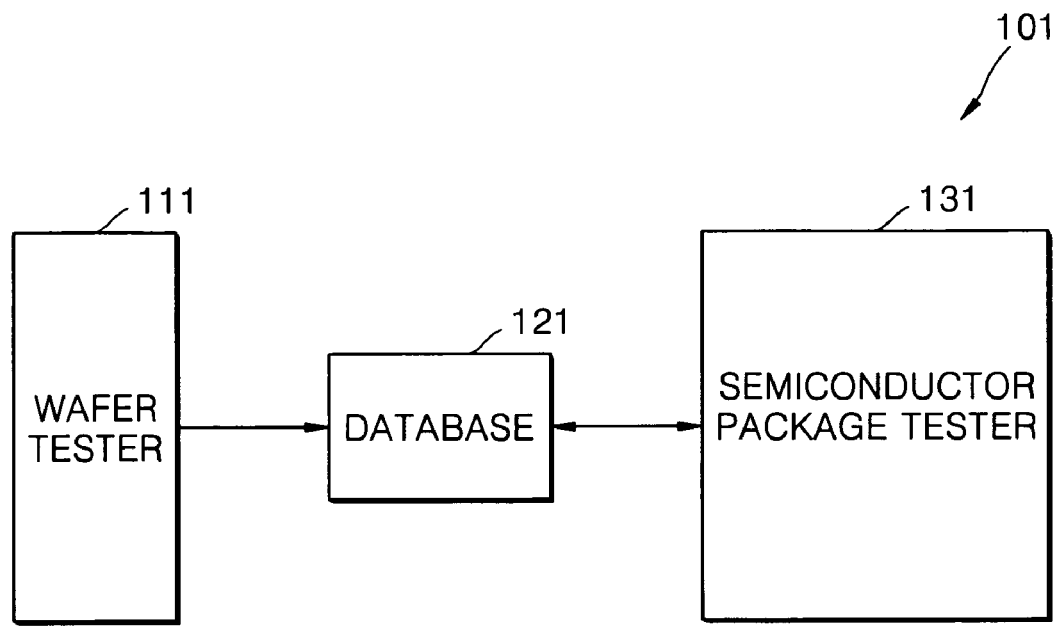
FIG. 1 is a block diagram of a standby current testing system according to an embodiment of the present invention.

Reference will now be made in detail to the embodiments of the present invention, examples of which are illustrated in the accompanying drawings, wherein like reference numerals refer to the like elements throughout.

FIG. 1 is a block diagram of a standby current testing system 101 according to an embodiment of the present invention. The standby current testing system 101 includes a wafer tester 111, a database 121, and a semiconductor package tester 131.

Figure 2:
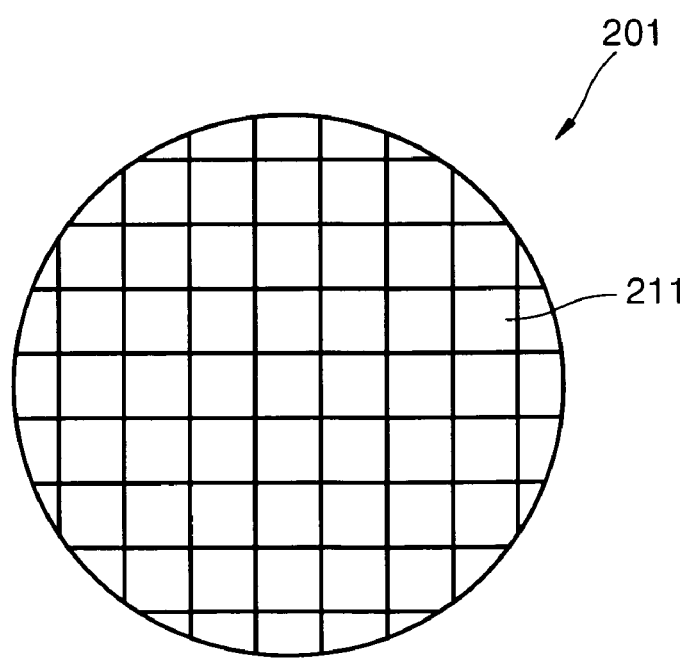
FIG. 2 shows a wafer tested by a wafer tester shown in FIG. 1.

The wafer tester 111 tests the electrical characteristics of a plurality of semiconductor chips 211 (FIG. 2) formed on a wafer 201 (FIG. 2) in an electrical die sort (EDS) testing process. To test the electrical characteristics of the semiconductor chips 211, a plurality of test parameters are used. Standby current is one such test parameter. The semiconductor chips 211 are diverse, and therefore, some semiconductor chips 211 need measurement of standby current while other semiconductor chips 211 do not need the measurement of standby current. Accordingly, the present invention is intended for use only for semiconductor chips needing the measurement of standby current. At least one wafer tester 111 is provided.

The database 121 stores data and is connected to the at least one wafer tester 111 and to the at least one semiconductor package tester 131 through a wired network such as a local area network (LAN). The database 121 may be included in the wafer tester 111 or the semiconductor package tester 131 or may be separately provided as an element of a computer system.

The semiconductor package tester 131 tests the electrical characteristics of a semiconductor package 301 (FIG. 3) in which the semiconductor chips 211 (FIG. 2) are embedded. The electrical characteristics of the semiconductor chips 211 may change during a packaging process. Semiconductor chips 211 having changed to an unacceptable degree in their electrical characteristics render the corresponding semiconductor package 301 a reject. Accordingly, in a final testing process of testing the semiconductor package 301, the semiconductor package tester 131 tests the semiconductor package 301 to sort it out when it is a reject. If the semiconductor package 301 is sorted out as a reject, the semiconductor package 301 is discarded. At least one semiconductor package tester 131 is provided.

FIG. 4 is a flowchart of a method for testing standby current of a semiconductor package according to an embodiment of the present invention. The method shown in FIG. 4 will be described with collective reference to FIGS. 1 through 4.

In operation 411, the wafer tester 111 tests all of the semiconductor chips 211 formed on the wafer 201 in an EDS testing process, collects measured values of the standby current of the respective semiconductor chips 211, and transmits the measured values to the database 121. While testing the semiconductor chips 211, the wafer tester 111 sorts out semiconductor chips 211 that are outside determined threshold parameters and marks them, for example, with ink so that those semiconductor chips 211 sorted out as rejects are not packaged. The wafer tester 111 collects measured values of standby current from only semiconductor chips 211 that have been sorted as good. The semiconductor chips 211 have a wafer run number. A wafer run number is assigned to a semiconductor chip according to conditions for wafer fabrication. In other words, the same wafer run number is allocated to semiconductor chips of wafers that have been fabricated under the same conditions while different wafer run numbers are assigned to semiconductor chips of wafers that have been fabricated under different conditions.

Next, the wafer tester 111 calculates the statistics of the measured values of standby current and transmits them to the database 121. The statistics can include the median, mean, and statistical spread or dispersion (distribution) of the measured values of standby current.

The median is a value picked from the center of the range of measured values of standby current, arranged in order of magnitude, i.e. a value corresponding to the center. If there are an odd number of observations, the middle one surely exists. If there are an even number of observations, the mean of two middle values is taken as the median.

The statistical dispersion indicates the distribution of the measured values of standby current and is expressed by a number indicating the state of distribution of the measured values of standby current around the mean of the measured values.

Figure 5A:
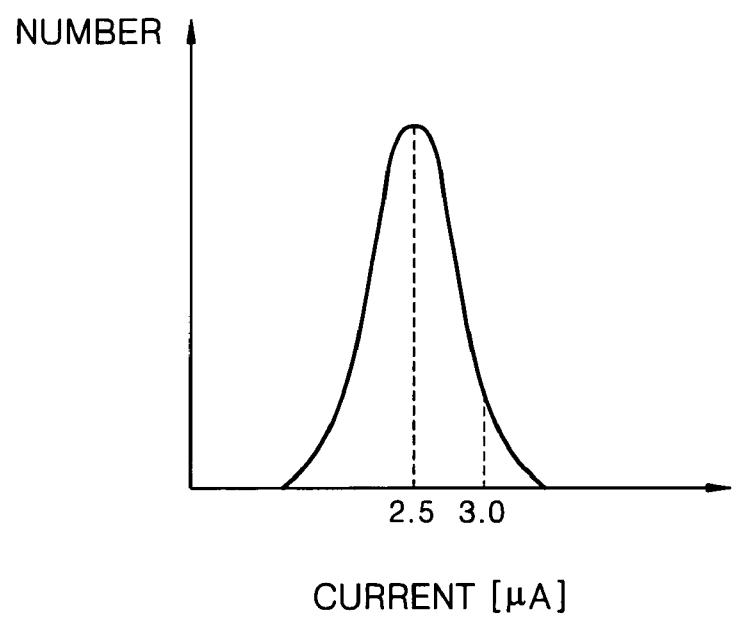
FIGS. 5A and 5B are graphs illustrating the statistical dispersion of measured values of standby current after an electrical die sort (EDS) test in the method shown in FIG. 4.
Figure 5B:
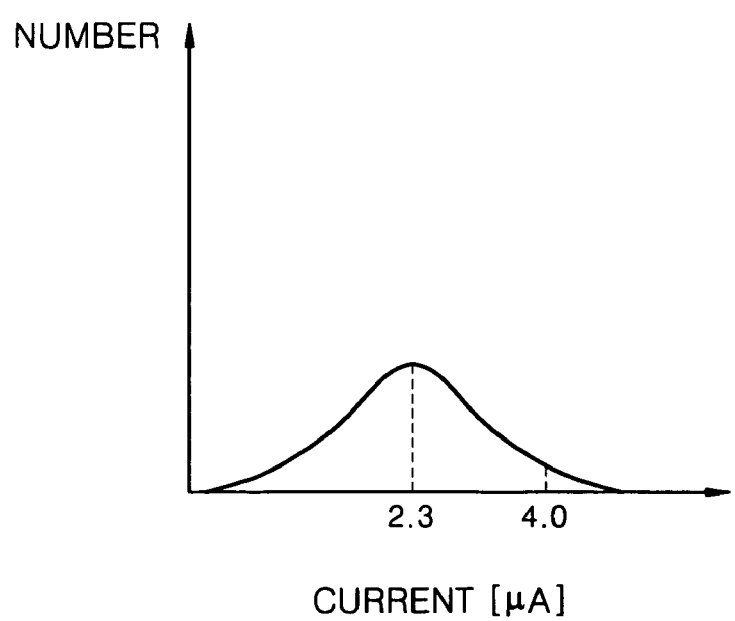

FIGS. 5A and 5B are graphs illustrating the statistical dispersion of measured values of standby current of the semiconductor chips having undergone the EDS testing process. Referring to FIG. 5A, the measured values of standby current concentrate in a narrow range. Referring to FIG. 5B, the measured values of standby current spread to a wide range. Besides, the measured values of standby current may concentrate at a lower portion or an upper portion, i.e. the distribution may not be representable as a bell curve. Also, the medians and distributions can vary, as contrasted in FIGS. 5A and 5B, wherein the medians are different as well as the distribution. The statistical dispersion of the measured values of standby current often varies with a wafer run number. The wafer tester 111 calculates the statistics with respect to each wafer run number.

In operation 421, the semiconductor package tester 131 recognizes a wafer run number of each semiconductor package 301 to be tested in a final test. In detail, an operator directly inputs the wafer run number of each semiconductor package 301 to be tested to the semiconductor package tester 131, and then the semiconductor package tester 131 recognizes the wafer run number. Alternatively, the operator may input the wafer run number by scanning, for example, a wafer run bar code.

A plurality of semiconductor packages 301 are transferred in lots (pluralities of units) to the final testing process. A single lot may have the same or different wafer run numbers. Accordingly, the operator is required to check the wafer run numbers allocated to the lot of semiconductor packages 301 when inputting them to the semiconductor package tester 131. In operation 431, the semiconductor package tester 131 requests and downloads the measured values of standby current of semiconductor chips 211 corresponding to the recognized wafer run number or the statistics of the measured values from the database 121.

In operation 441, the semiconductor package tester 131 extracts a boundary value defining predetermined upper values, e.g., upper 5% of the measured values of standby current, from the measured values of standby current or the statistics thereof. The boundary value is 3.0 microamps (μA) in the graph shown in FIG. 5A and is 4.0 μA in the graph shown in FIG. 5B.

In operation 451, the semiconductor package tester 131 sets the boundary value as a standby current limit of a program for testing the semiconductor packages 301. Here, the boundary value is not a limit used to sort out rejects but a limit used to sort out semiconductor packages 301 to be tested for reliability. A reject limit used to sort out semiconductor packages 301 having poor standby current in the final testing process is set to be higher than the boundary value. The semiconductor package tester 131 generates standby current data using the boundary value and, using the test program and the generated standby current data, tests the standby current relative to the standby current limit.

In operation 461, the semiconductor package tester 131 tests the semiconductor packages 301 based on the standby current limit. Here, the semiconductor package tester 131 sorts out semiconductor packages 301 that are outside the standby current limit. The sorted-out semiconductor packages 301 are transferred to a reliability testing process.

When a wafer run number changes in the lot of semiconductor packages 301, operations 431 through 461 are repeated. If the entire lot has the same wafer run numbers, repetition is not needed.

As described above, the semiconductor package tester 131 sets the standby current limit for the semiconductor packages 301 based on the measured values of standby current of the semiconductor chips 211, which are collected by the wafer tester 111.

Figure 6:
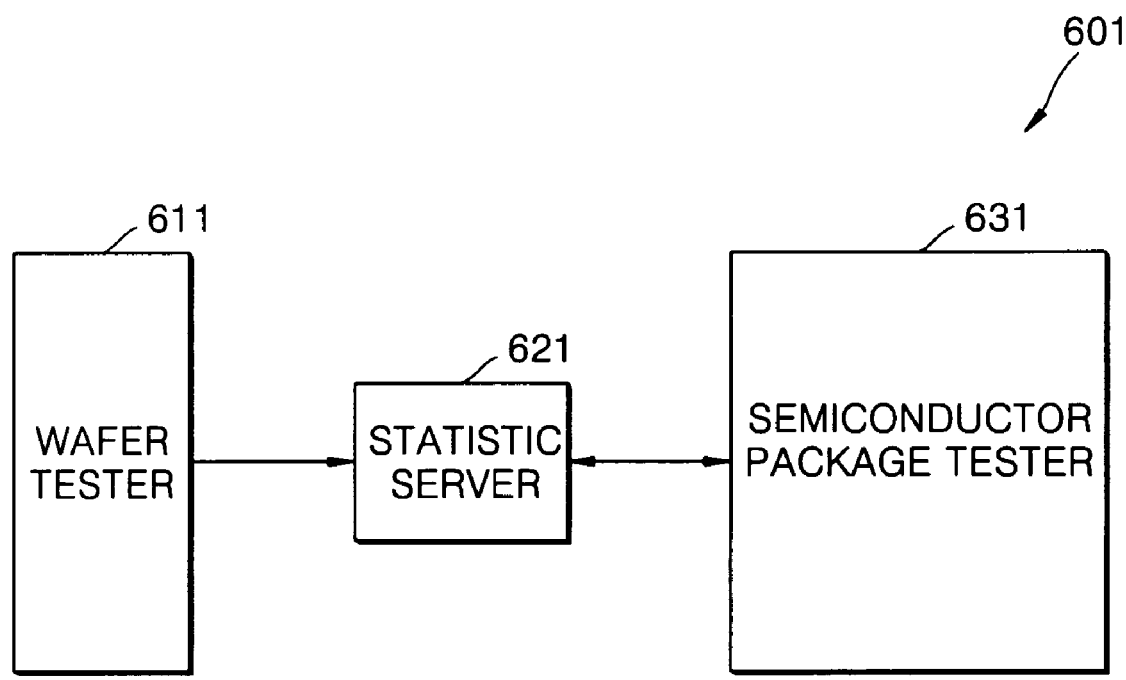
FIG. 6 is a block diagram of a standby current testing system according to another embodiment of the present invention.

FIG. 6 is a block diagram of a standby current testing system 601 according to another embodiment of the present invention. The standby current testing system 601 includes a wafer tester 611, a statistic server 621, and a semiconductor package tester 631.

The wafer tester 611 tests the electrical characteristics of a plurality of semiconductor chips 211 (FIG. 2) formed on a wafer 201 (FIG. 2) in an EDS testing process. The wafer tester 611 collects the measured values of standby current among the electrical characteristics of the semiconductor chips 211 (FIG. 2) and transmits them to the statistic server 621. At least one wafer tester 611 is provided.

The statistic server 621 calculates the statistics from the measured values of standby current received from the wafer tester 611. Thereafter, the statistic server 621 extracts a boundary value defining predetermined upper values, e.g., upper 5% of the measured values of standby current, from the measured values of standby current or the statistics. The statistic server 621 is connected to at least one wafer tester 611 and at least one semiconductor package tester 631 through a wired network such as a LAN.

Figure 3:
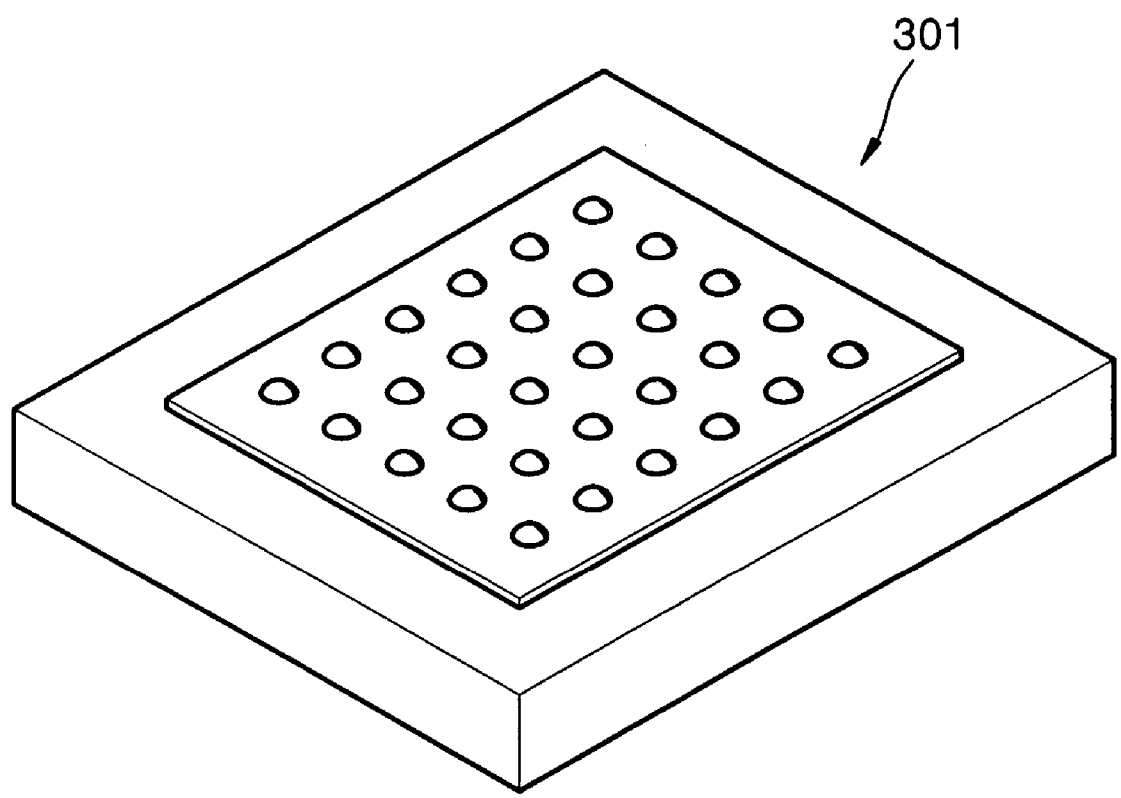
FIG. 3 shows an example of a semiconductor package tested by a semiconductor package tester shown in FIG. 1.

The semiconductor package tester 631 sets the boundary value received from the statistic server 631 as a standby current limit of a semiconductor package test program and tests semiconductor packages 301 (FIG. 3). At least one semiconductor package tester 631 is provided.

Figure 7:
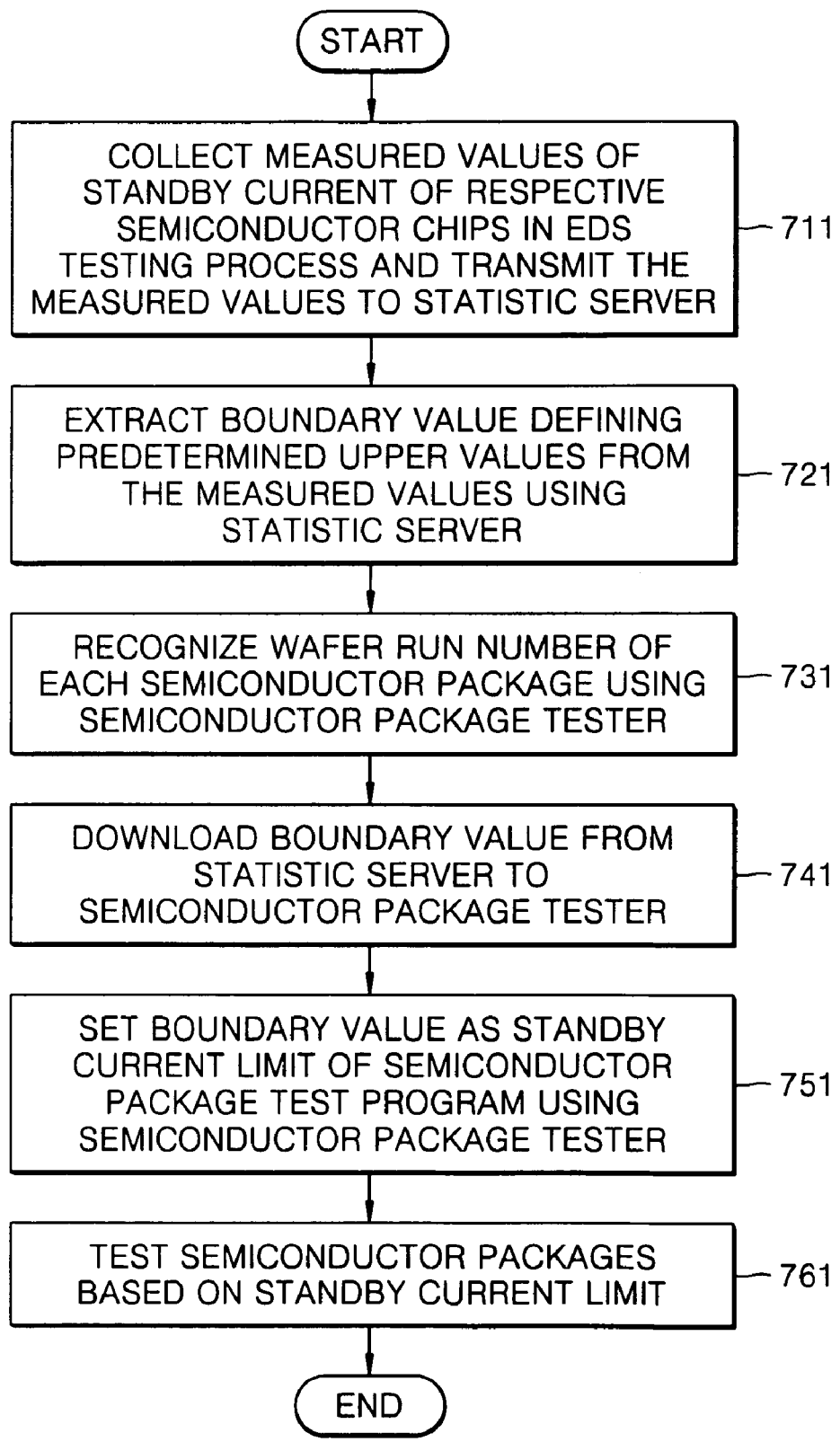
FIG. 7 is a flowchart of a method for testing standby current of a semiconductor package according to another embodiment of the present invention.

FIG. 7 is a flowchart of a method for testing standby current of a semiconductor package according to another embodiment of the present invention. The method shown in FIG. 7 will be described with reference to FIGS. 2, 3, and 6, collectively.

In operation 711, the wafer tester 611 tests all of the semiconductor chips 211 formed on the wafer 201 in an EDS testing process, collects measured values of the standby current of the respective semiconductor chips 211, and transmits the measured values to the statistic server 621. While testing the semiconductor chips 211, the wafer tester 611 sorts out semiconductor chips 211 that are outside a reject threshold or limit as rejects and marks them, for example, with ink so that those semiconductor chips 211 sorted out as rejects are not packaged. The wafer tester 611 preferably collects measured values of standby current from only semiconductor chips 211 that have been sorted as good. The wafer tester 611 collects the measured values of standby current by wafer run numbers. A wafer run number is assigned according to conditions for wafer fabrication. Wafers fabricated under the same conditions have the same wafer run numbers.

In operation 721, the statistic server 621 extracts a boundary value defining predetermined upper values, e.g., upper 5% of the measured values of standby current, from the measured values of standby current. The boundary value is 3.0 μA in the graph shown in FIG. 5A and is 4.0 μA in the graph shown in FIG. 5B. The statistic server 621 extracts the boundary value with respect to each wafer run number.

When extracting the boundary value, the statistic server 621 may calculate and use the statistics of the measured values of standby current. The statistics may include the median, mean, and statistical spread or dispersion of the measured values of standby current. The median, mean, and statistical dispersion have been described with reference to FIG. 4, and thus a description thereof will be omitted.

In operation 731, the semiconductor package tester 631 recognizes a wafer run number of each semiconductor package 301 to be tested in a final test. In detail, an operator directly inputs the wafer run number of each semiconductor package 301 to be tested to the semiconductor package tester 631, and then the semiconductor package tester 631 recognizes the wafer run number. Alternatively, the operator may input the wafer run number using scanning, as described above.

A plurality of semiconductor packages 301 are transferred in lots (pluralities of units) to the final testing process. Here, the semiconductor packages 301 included in a single lot may have the same or different wafer run numbers. Accordingly, the operator needs to exactly check the wafer run numbers allocated to the lot of semiconductor packages 301 when inputting them to the semiconductor package tester 631.

In operation 741, the semiconductor package tester 631 downloads the boundary value corresponding to the recognized wafer run number from the statistic server 621.

In operation 751, the semiconductor package tester 631 sets the boundary value as a standby current limit of a program for testing the semiconductor packages 301. Here, the standby current limit is not a limit used to sort out rejects but a limit used to sort out semiconductor packages 301 to be tested for reliability. A reject threshold or limit used to sort out semiconductor packages 301 having poor standby current in the final testing process is set to be higher than the boundary value. The semiconductor package tester 631 generates standby current data using the boundary value downloaded from the statistic server 621 and, using the test program and the generated standby current data above the boundary value, measures the standby current.

In operation 761, the semiconductor package tester 631 tests the semiconductor packages 301 based on the standby current limit. Here, the semiconductor package tester 631 sorts out semiconductor packages 301 that are outside the standby current limit. The sorted-out semiconductor packages 301 are transferred to a reliability testing process.

When a wafer run number changes, operations 741 through 761 are repeated. If the wafer run numbers are the same, repetition is not needed.

As described above, the semiconductor package tester 631 receives the boundary limit for the measured values of standby current from the statistic server 621 and sets the standby current limit for the final test of the semiconductor packages 301.

As described above, according to the present invention, a standby current limit used to sort out semiconductor packages to be tested for reliability in a final testing process is automatically set by the semiconductor package tester 131 or the statistic server 621 based on measured values of standby current that have been collected in an EDS testing process. Accordingly, an operator does not need to manually adjust the standby current limit of a test program in the final testing process when standby current characteristics change during a packaging process. Instead the standby current limit of the test program is automatically adjusted for further semiconductor package testing, thereby preventing waste of labor and remarkably reducing final testing time. In addition, the quality of semiconductor packages and the yield of the final testing process increases.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method for testing standby current of a semiconductor package, the method comprising:
   (a) testing semiconductor chips formed on a wafer, collecting measured values of standby current of the semiconductor chips, and storing the measured values of standby current in a database, by using a wafer tester, the semiconductor chips having a predetermined wafer run number;
   (b) packaging one or more of the semiconductor chips from the wafer in respective semiconductor packages, wherein the wafer run number of the semiconductor chips of each of the semiconductor packages to be tested is recognized;
   (c) downloading measured values of standby current of semiconductor chips corresponding to the recognized wafer run number from the database to a semiconductor package tester;
   (d) extracting a boundary value defining predetermined upper-limit values of the downloaded measured values of standby current;
   (e) automatically setting the boundary value as a standby current limit of a program for testing the semiconductor packages by use of the semiconductor package tester; and
   (f) testing the semiconductor packages based on the standby current limit.

2. The method of claim 1, wherein the database is connected to at least one wafer tester and at least one semiconductor package tester through a wired network.

3. The method of claim 1, wherein the standby current limit is set to sort out semiconductor packages to be tested for reliability.

4. The method of claim 1, wherein (d) comprises extracting the boundary value for the wafer run number.

5. The method of claim 1, further comprising repeating (c) through (f) when the wafer run number changes.

6. The method of claim 1, wherein wafer run numbers of the semiconductor packages to be tested are directly input by an operator to the semiconductor package tester.

7. A method for testing standby current of a semiconductor package, the method comprising:
   (a) testing semiconductor chips formed on a wafer and transmitting measured values of standby current of the semiconductor chips to a statistic server, by using a wafer tester, the semiconductor chips having a predetermined wafer run number;
   (b) extracting a boundary value defining predetermined upper values of the measured values of standby current, by using the statistic server;
   (c) packaging one or more of the semiconductor chips from the wafer in respective semiconductor packages, wherein the wafer run number of the semiconductor chips of each of semiconductor packages to be tested is recognized;
   (d) downloading the boundary value corresponding to the recognized wafer run number from the statistic server to a semiconductor package tester;
   (e) setting the boundary value as a standby current limit of a program for testing the semiconductor packages, by using the semiconductor package tester; and
   (f) testing the semiconductor packages based on the standby current limit, by using the semiconductor package tester.

8. The method of claim 7, wherein the statistic server is connected to at least one wafer tester and at least one semiconductor package tester through a wired network.

9. The method of claim 7, wherein the standby current limit is set to sort out semiconductor packages to be tested for reliability.

10. The method of claim 7, wherein (b) comprises extracting the boundary value with respect to a wafer run number by using the statistic server.

11. The method of claim 7, further comprising repeating (d) through (f) whenever the wafer run number changes.

12. The method of claim 7, wherein wafer run numbers of the semiconductor packages to be tested are directly input by an operator to the semiconductor package tester.

13. A semiconductor standby current testing system comprising:
- a wafer tester for measuring wafer standby currents;
- a database operatively coupled with the wafer tester for storing such measured standby currents; and
- a semiconductor package tester operatively coupled with the database for setting standby current conditions under which to test semiconductor package reliability based upon the measured and stored wafer standby currents.

14. The system of claim 13, wherein the package tester derives the package test standby current conditions from the measured wafer standby currents using predetermined stored criteria for each or a plurality of wafers.

15. The system of claim 14, wherein the database includes a statistical server configured to extract a boundary value defining a wafer current limit from the stored and measured standby currents, and wherein the package tester uses the extracted boundary value as at least a part of the predetermined stored criteria to derive the current conditions under which to test semiconductor package reliability.

16. The system of claim 15, wherein the database stores measured standby currents for plural wafers, wherein the server is configured to extract plural boundary values for the plural wafers to define plural wafer current limits, and wherein the package tester recognizes to which particular one of the plural wafers a particular one of the plural boundary values applies and uses the particular one of the plural boundary values to test semiconductor package reliability of semiconductor packages that form a part of the particular one of the plural wafers.

* * * * *